United States Patent [19]

Kompelien

[11] 4,409,552

[45] Oct. 11, 1983

[54] CYCLIC MEANS WITH MAGNETIC LATCH FOR CHECKING SWITCH INTEGRITY

[75] Inventor: Arlon D. Kompelien, Richfield, Minn.

[73] Assignee: Honeywell Inc., Minneapolis, Minn.

[21] Appl. No.: 254,813

[22] Filed: Apr. 16, 1981

[51] Int. Cl.³ .............................................. G01R 31/02
[52] U.S. Cl. .................................................. 324/415
[58] Field of Search ..................... 324/415; 335/78, 79, 335/81, 179, 229, 230, 222; 340/644

[56] References Cited

U.S. PATENT DOCUMENTS

| | | | |
|---|---|---|---|
| 1,290,658 | 1/1919 | Reed | 361/194 |
| 1,349,429 | 8/1920 | Murray et al. | 335/58 |
| 1,753,180 | 4/1930 | Whittingham | 361/194 |
| 1,767,058 | 6/1930 | Eiseman | 335/236 |
| 2,170,694 | 8/1939 | Perry | 175/294 |
| 2,262,061 | 11/1941 | Somers | 175/335 |
| 2,772,332 | 11/1956 | Carlson | 200/88 |
| 3,387,188 | 6/1968 | Euler | 317/155.5 |
| 3,431,002 | 3/1969 | Melgaard | 292/251.5 |
| 3,452,271 | 6/1969 | Ketter | 324/415 |
| 3,506,883 | 4/1970 | Sugiyama | 317/154 |
| 3,597,712 | 8/1971 | Nakagome et al. | 335/151 |
| 3,925,722 | 12/1975 | Fohrhaltz et al. | 324/415 |

Primary Examiner—Michael J. Tokar
Assistant Examiner—Kevin D. O'Shea
Attorney, Agent, or Firm—Alfred N. Feldman

[57] ABSTRACT

A means for physically opening and closing electrical contacts to check their integrity for safety systems is provided. Contact means are cycled by the movement of two relatively moveable parts and the actual physical operation of the contacts is checked. The system is latched in its operable position by reversing the energization of an electromagnet which was used to unlatch or start the checking sequence.

9 Claims, 3 Drawing Figures

CYCLIC MEANS WITH MAGNETIC LATCH FOR CHECKING SWITCH INTEGRITY

BACKGROUND OF THE INVENTION

There are numerous types of electrical control and indicating units that have an electric switch as an output element. In many of these types of units it is desirable to be able to check the integrity of that output switch element. If the output switch element is one which must be opened to provide the desired function there is always the risk that the switch element will be inoperable due to welding or some other problem. If the output switch element is a switch which is normally open, there is the problem of whether a circuit element connected to the switch may inadvertently have become open circuited.

In the case of normally closed output switches it has been common practice to electrically check the continuity of the switch and make the assumption that if the switch shows continuity that the switch element is in proper operating condition. There is no way of determining whether the switch has become inadvertently welded or is otherwise inoperable in a closed position. In the case of a normally open output switch a check of continuity that checks for an open circuit may also be unreliable. If the circuitry connected to switch inadvertently has become open circuited, the true status of the output switch is not detectable. In many types of safety equipment, such as burner control equipment, it is essential that the true nature of the output control switch be reliably determined. In certain types of safety related equipment, redundant switches are used to improve reliability, but this becomes an expensive expedient that may also be subject to the same problems as were noted above.

SUMMARY OF THE INVENTION

In the present invention, output switches are reliably checked for integrity. The switches are in fact mechanically actuated through a cycle of their operation and the switch opening and closing is checked by the control circuitry that operates the switch to ensure the integrity of the switch means. This requires that the control circuitry operates an electromagnetic means and check the contacts for integrity during a predetermined time interval. In the case of a normally closed switch, the switch is mechanically allowed to open, the switch opening is verified, and the switch is then reclosed. In the case of a normally open contact, the open circuit is identified, the switch is mechanically closed, and then the switch circuit is again checked to ensure that the switching function has occurred. The switch is then allowed to return to its normally open state. The present invention is carried out by the use of a biased mechanical mass, and the latching and unlatching functions of an electromagnetic means accompanied by a permanent magnetic means.

In the present invention a biased mechanical mass is unlatched by the use of an electromagnet and is allowed to move the switch element for checking by the circuitry that controls the electromagnet. The biased mechanical mass then causes the switch element to approach its original state. The electromagnetic means is then reversibly energized at an appropriate time to overcome the loss of motion due to friction, and the system is latched into its original state. This allows for the actual mechanical opening and closing of the switch means along with the checking of the switch means to make sure that the integrity of the electrical switch means is proper.

In the event that the switch means fails to operate properly, reset means is provided to mechanically move the biased mechanical means with the contact means to reset the device. This function can be used as a safety type of switch means.

DESCRIPTION OF THE PREFERRED EMBODIMENTS

Figure 1:
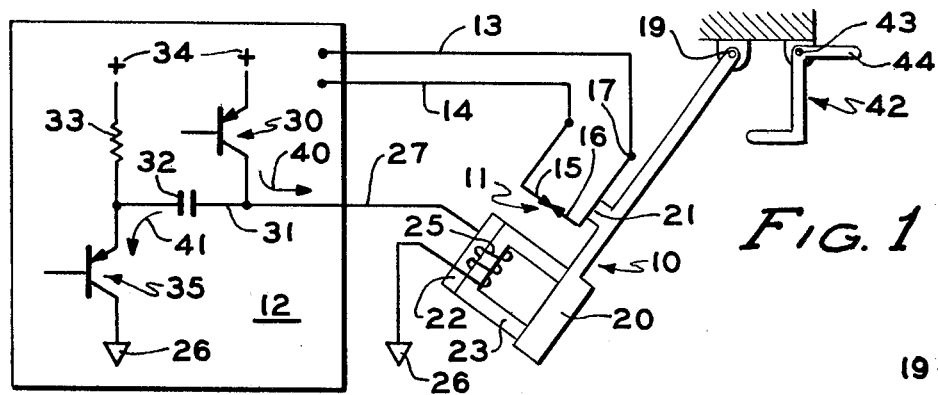
FIG. 1 is a schematic representation of a normally closed checking arrangement.

A means for checking the electrical integrity of electric switches is generally disclosed at 10, and includes a switch means 11 with normally closed contacts, the integrity of which is critical to the operation of a circuit means or system generally disclosed at 12. The circuit means or system disclosed at 12 can be any type of alarm or safety system that includes a pair conductors 13 and 14 that are connected to the switch means 11 with a fixed switch element 15 connected to conductor 14. A switch element 16 is connected at a pivot 17 to the conductor 13, and the switch element 16 is capable of rotating counterclockwise about the pivot 17 when a pendulum 20 is allowed to swing in a counterclockwise manner under the force of gravity. The pendulum 20, in effect, is any type of biased mechanical mass, but it is shown as a pendulum in FIG. 1. The pendulum 20 has a projection 21 that holds switch element 16 against the switch element 15 to keep the switch means 11 closed when the pendulum 20 is in the position shown. The pendulum is pivoted around a pivot point 19 and the pendulum 20 is made of a magnetic material.

The pendulum 20 is held in the position disclosed in FIG. 1 under the influence of a permanent magnet means 22 that is attached to an electromagnet means 23. The permanent magnet means 22 and the electromagnet means 23 form magnetic means that includes a controllable electromagnetic means and the permanent magnetic means with the pendulum 20 being relatively moveable with respect to the combination of the permanent magnet means 22 and the electromagnet means 23. The electromagnet means 23 has a coil 25 that is grounded at 26, and is connected by conductor 27 to the electric circuit means 12. The permanent magnet means 22 can be effectively neutralized by a current flowing in the coil 25 of the electromagnet 23 thereby releasing the pendulum 20. The manner in which this is utilized will be described after the balance of the circuitry in FIG. 1 is disclosed.

The conductor 27 that is connected to the coil 25 is connected to the electric circuit means 12 to receive power through a transistor 30. The switching of transistor 30 into a conductive state allows current to be drawn through the coil 25 to overcome the magnetic pull of the permanent magnet means 22. The manner in which this switching is accomplished will be described subsequently.

Connected to the conductor 27 is a further conductor 31 that is connected to a capacitor 32 that is connected through a resistor 33 to a source of potential 34 that is common to this portion of the circuit and the transistor 30. The resistor 33 and the capacitor 32 are connected to a further transistor means 35 that is connected to ground at 26 and is controlled in a timed relationship to the transistor 30. When the transistor 30 is conducting a current (shown at 40) it is allowed to flow into the coil 25 through the conductor 27. If the transistor means 30 is nonconductive, and the transistor means 35 is allowed to conduct, a charge on the capacitor 32 is allowed to flow (as shown at 41) through the transistor means 35, ground 26, and the coil 25 thereby driving current through the coil 25 in an opposite direction to that disclosed as current at 40. The current 40 will be referred to as the unlatching current, and the current 41 will be referred to as the latching current. The reason for this will become clear in connection with the description of the operation of the device of FIG. 1. The device in FIG. 1 is completed by a manually operated reset lever means 42 that is pivoted at 43 and is capable of applying force against the pendulum 20 when the end 44 of the lever is brought down to cause the lever 42 to rotate in a clockwise direction.

OPERATION OF FIG. 1

The device in FIG. 1 is designed to check the continuity of the switch means 11 between the normally closed state (as shown) and an open state. The checking is accomplished by the circuit means 12 sensing continuity on conductors 13 and 14. The same conductors are ultimately used as final control circuits for a device which uses the contact means 11. The circuit means 12 functions to energize the transistor means 30 to allow current 40 to flow in coil 25. The coil 25 overcomes the attraction of the permanent magnet means 22 and releases the pendulum 20 to swing in a counterclockwise direction. The release of the pendulum 20 allows the contact element 16 to pivot at 17 thereby opening the contact means 11. The fact that the contact means 11 has opened is verified by circuit means 12.

After the pendulum 20 swings to its extreme in the couterclockwise direction, the natural force of gravity on the pendulum 20 causes it to start to swing back in the clockwise direction. Due to the friction of pivot 19 and the air friction on the pendulum 20, it will not normally return to the position shown in FIG. 1, unless something else occurs. The additional function added by the device of FIG. 1 is that circuit means 12 switches the transistor 30 to an "off" state, and switches the transistor 35 to an "on" state thereby causing it to conduct and discharge the capacitor 32 (latching current 41) into the electromagnetic coil 25 in a reverse direction to the unlatching current 40. The latching current 41 passing through the coil 25 supplements the permanent magnetic 22 thereby creating a sufficient pull on the pendulum 20 as it nears the electromagnetic means 23 to attract the pendulum 20 into the position shown in FIG. 1 where it latches itself due to the continued effect of the permanent magnet 22. This action then allows the contact element 16 to be engaged with the contact element 15 to close the switch means 11. This allows for a physical opening and closing of the switch means 11. By the proper timed sensing on conductors 13 and 14 the switch means 11 is checked. This is critical in certain types of safety systems.

Operation of the pendulum mechanism in a control is to provide system lockout when an unsafe condition is detected. When an unsafe condition is detected the circuit means 12 would provide an unlatching current 40 but not a latching current 41 at the proper time. When this happens, the pendulum 20 swings for a short time and comes to rest with the pendulum 20 some distance from the electromagnet 23. This distance is sufficient to prevent the latching current 41 from reclosing contact means 11. Under this condition the system is locked out and can only be reset manually through the lever means 42. In case proper operation of the contacts 15 and 16 is not detected during a pendulum swing check cycle, the logic of the circuit means 12 would normally cause a safe operating state and an indication of the problem could be annunciated.

Figure 2:
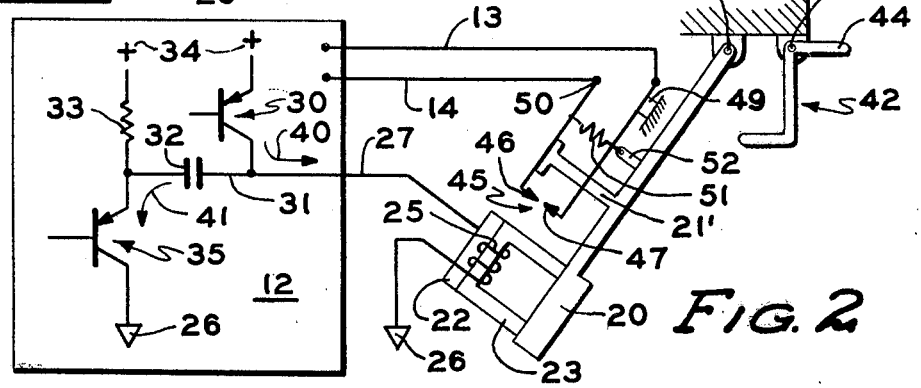
FIG. 2 is a schematic arrangement similar to FIG. 1 but for checking normally open contacts.

The system disclosed in FIG. 1 checks a pair of normally closed contact elements 15 and 16, but this principle can be applied to normally open switch means 45 of FIG. 2. A normally open contact element 46 acts with a normally open contact element 47. The pendulum 20 is provided again with the electromagnetic means 23 and the permanent magnet 22 along with the circuit means 12. The switch means 45 includes the moveable switch element 46 pivoted at 50 and is spring biased at 51 by a projection 52 on the pendulum 20. The pendulum 20 further has a projection 21' that engages the moveable element 46 of the switch means 45 and this moveable element is connected to the conductor 14 as is similar to FIG. 1. A conductor 13 connects to the switch element 47, which is fixed at 49 in space.

OPERATION OF FIG. 2

The operation of FIG. 2 is similar to that of FIG. 1 except for the switch action of the switch means 45. The switch means 45 is shown as a normally open switch. When the pendulum 20 swings free of the electromagnet 23, the spring 51 pulls the moveable element 46 in a counterclockwise direction thereby allowing the contact element 46 to complete a circuit to the contact element 47. This closing of the switch means 45 is verified via the conductors 13 and 14. When the pendulum 20 swings back to the position shown, the switch means 45 is caused to become open circuited and this can be used by the circuit means 12 as a verification of the proper operation of the switch means 45.

In FIGS. 1 and 2 a normally open switch means and a normally closed switch means have been disclosed using a pendulum action merely as a means of explaining the operation of the device. A means for checking the electrical integrity of an electric switch means of a more practical nature is disclosed in FIG. 3.

Figure 3:
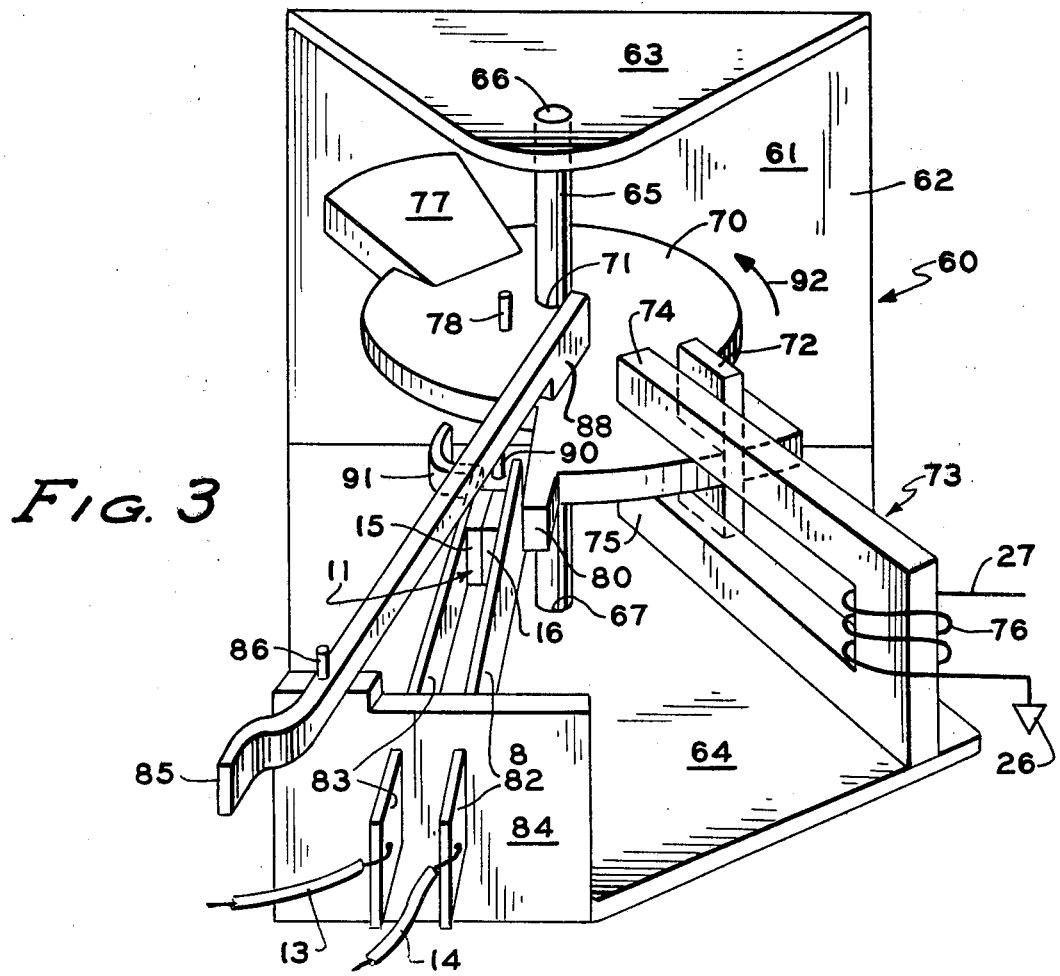
FIG. 3 is an isometric view of a switch checking means using a torsional balance arrangement.

In FIG. 3 a means for checking the electrical integrity of the electric switch means 11 is disclosed at 60. The means for checking the electrical integrity 60 is substantially immune from the position in which it is mounted due to the nature of the structure, which will now be described. A U-shaped frame 61 has an upstanding or bight portion 62 and two projections 63 and 64. Between the projection 63 and 64 there is mounted a torsional rod 65 that is anchored at 66 and at 67. The torsional rod 65 supports a disclike mass 70 that is attached rigidly at 71 to the rod 65. The mass 70 mounts a permanent magnetic means 72 that cooperates with electromagnetic means 73. The electromagnetic means 73 has a pair of projections 74 and 75 that abut the permanent magnetic means 72. The electromagnetic means 73 is completed by a winding 76. The permanent magnetic means 72 and the electromagnetic means 73 correspond with the elements 23 and 22 of FIG. 1.

Mounted on the mass 70 is a weight 77 which balances the mechanical mass 70 that is held in a torsional restraint by the permanent magnetic means 72 and the legs 74 and 75 of the electromagnetic means 73. The mass 70 has a pin 78 that acts as part of a reset mechanism which will be described subsequently. The mass 70 has a projection 80 that holds the switch element 16 of the switch means 11 against the switch element 15, as is comparable to FIG. 1. The switch element 16 is mounted on a flexible conductive arm 82, while the switch element 15 is mounted on a flexible conductive arm 83. The flexible arm 82 is connected to the conductor 14 while the flexible conductive arm 83 is connected to the conductor 13. The two arms 82 and 83 are mounted in an insulating member 84 that is attached to the leg 64 of the U-shaped structure 60. The flexible members 82 and 83, which support the contact element 16 and 15 of the switch means 11, are so designed that the projection 80 holds the switch means 11 in a closed condition in the position of the device as disclosed in FIG. 3.

The device of FIG. 3 is completed by a reset arm 85 that is pivoted at 86 in the insulating member 84. The arm 85 has a projection 88 that engages the pin 78 when the device is in need of reset. The arm 85 has a further projection 90 that is capable of engaging a projection 91 that is formed as an extension of the flexible member 83 that supports the contact element 15. The function of these elements will be described in connection with the reset motion for the device.

OPERATION OF FIG. 3

In the position shown in the drawing, the switch element 15 and 16 complete an electric circuit between the conductors 13 and 14, and are comparable to the circuit configurations in FIG. 1. Upon the supplying of a current to the winding 76, the attraction between the permanent magnetic means 72 and the ends 74 and 75 of the electromagnetic means 73 is reduced sufficiently so that the mass 70 rotates in a counterclockwise direction as is disclosed by an arrow 92. The motion of the mass 70 in the direction indicated at 92 allows the torsional rod 65 to become unstressed and the mass 70 along with the weight 77 causes the entire mass 70 to rotate. When the projection 80 moves away from the flexible member 82, the contact elements 15 and 16 are allowed to separate, as was the case in FIG. 1.

The torsional mass 70 and the torsional rod 65 eventually stop their rotation in the counterclockwise direction, and the mass starts to swing back in the clockwise direction. As the permanent magnetic means 72 approaches the electromagnetic means 73, the coil 76 is energized with current attracting the permanent magnetic means 72 to the ends 74 and 75 of the electromagnetic means 73. This causes the switch elements 15 and 16 to be brought into a closed position as shown.

The system described to this point is a torsional biased mechanical mass that operates in place of the pendulum arrangement disclosed in FIGS. 1 and 2. This arrangement is substantially free of the position of mounting. The electrical circuit means 12 of FIG. 1 is applicable to FIG. 3 and has not been described again.

The device of FIG. 3 has a reset mechanism that includes the lever 85 that is pivoted at 86. In the event that the mass 70 moves in the counterclockwise direction 92 and becomes unlatched with the permanent magnetic means 72 separated from the electromagnetic means 73, the pin 78 will be an engagement with the projection 88 of the lever 85. By pushing against the lever 85 to cause it to rotate in a counterclockwise direction, the pin 90 engages the projection 91 and holds the contact elements 15 and 16 apart while element 16 is forced back to its normal position for being closed. This ensures that the contact means 11 is open during the reset action, which is a requirement in certain types of safety equipment. At the same time the projection 88 moves against the pin 78 causing the mass 70 to be rotated against the torsional rod 65 until the permanent magnetic means 72 engages the ends 74 and 75 of the electromagnetic means 73. This allows the permanent magnetic means 72 to latch the mechanism and the release of the lever 85 allows the contact elements 15 and 16 to engage once again as shown in FIG. 3.

The systems disclosed allow for the checking of the electrical integrity of electric switch means that are normally opened or normally closed. The systems disclosed in FIGS. 1 and 2 are of simple pendulum operated arrangements which may be used where the mounting of the device can be controlled. In the event that the mounting of the device cannot be controlled, a system as described in FIG. 3 that uses a biased mechanical mass including a torsional element that is not gravity dependent can be applied. The electric circuit means used with the device can be of any type and can be readily accomplished by conventional discrete component electronics, or by the use of microprocessor or microcomputer types of circuitry. The applicant has disclosed three different embodiments for the present invention. It is obvious that the concept involved can be applied in many different types of physical configurations, and as such the applicant wishes to be limited in the scope of his invention solely by the scope of the appended claims.

The embodiments of the invention in which an exclusive property or right is claimed are defined as follows:

1. A means for checking the electrical integrity of electric switch means, including: switch means capable of being mechanically operated by movement of a biased mechanical mass; magnetic means including electromagnetic means and permanent magnetic means with said magnetic means having two relatively moveable parts with said relatively moveable parts being attracted to each other against said biased mechanical mass by said permanent magnetic means when said electromagnetic means is deenergized; a first of said parts being moved with said biased mechanical mass and a second of said parts being fixed in space; said permanent magnetic means holding said two moveable parts engaged to establish a first state for said switch means, and said electromagnetic means being energized to neutralize said permanent magnetic means to allow said biased mechanical means to disengage said two moveable parts to establish a second state for said switch means; reset means capable of manually moving said baised mechanical mass from said second state to said first state in the event that said two moveable parts fail to become engaged; electric circuit means connected to said electromagnetic means and said switch means to controllably energize said electromagnetic means to allow said moveable parts to move from said first state to said second state; said biased mechanical mass tending to return said moveable parts toward said first state with said electric circuit means being operated to reverse the energization of said electromagnetic means at a proper time to cause said electromagnetic means to attract and hold said moveable parts in said first state; and said electric circuit means verifying the operation of said switch means when said moveable parts change between said states.

2. A means for checking the electrical integrity of electric switch means as described in claim 1 wherein said biased mechanical mass is a pendulum as a first of said moveable parts, and said electromagnetic means and said permanent magnetic means is fixed in space.

3. A means for checking the electrical integrity of electric switch means as described in claim 2 wherein said permanent magnetic means is a permanent magnet and said electromagnetic means includes a magnetic coil mounted upon a permeable magnetic element.

4. A means for checking the electrical integrity of electric switch means as described in claim 3 wherein said switch means includes a pair of switch contacts which are held closed when said pendulum is in said first state, and which are verified as open when said pendulum is in said second state.

5. A means for checking the electrical integrity of electric switch means as described in claim 1 wherein said biased mechanical mass is a torsionally suspended mass with said mass being a portion of one of said moveable parts.

6. A means for checking the electrical integrity of electric switch means as described in claim 5 wherein said mass supports said permanent magnetic means while said electromagnetic means is fixed in space.

7. A means for checking the electrical integrity of electric switch means as described in claim 6 wherein said permanent magnetic means is a permanent magnet and siad electromagnetic means includes a magnetic coil mounted upon a permeable magnetic element.

8. A means for checking the electrical integrity of electric switch means as described in claim 7 wherein said switch means includes a pair of switch contacts which are held closed when said torsionally suspended mass is in said first state, and which are verified as open when said torsionally suspended mass is in said second state.

9. A means for checking the electrical integrity of electric switch means as described in claim 8 wherein said reset means mechanically separates said pair of switch contacts when said mass is moved to said first state to ensure that said contacts have not welded shut.

* * * * *